United States Patent [19]

Anderson

[11] Patent Number: 5,767,677
[45] Date of Patent: Jun. 16, 1998

[54] SUPPRESSION OF RADIATION DAMPING IN NMR

[75] Inventor: Weston A. Anderson, Palo Alto, Calif.

[73] Assignee: Varian Associates, Inc., Palo Alto, Calif.

[21] Appl. No.: 694,886

[22] Filed: Aug. 9, 1996

[51] Int. Cl.[6] .................................................. G01R 33/20
[52] U.S. Cl. ............................................. 324/322; 324/318
[58] Field of Search ..................................... 324/300, 307, 324/309, 318, 311; 128/653.5

[56] References Cited

U.S. PATENT DOCUMENTS

| 5,278,503 | 1/1994 | Keller et al. ............................. 324/318 |
| 5,592,088 | 1/1997 | Matsunaga et al ....................... 324/318 |

OTHER PUBLICATIONS

Louis–Joseph et al. "Neutralization of Radiation Dampling by Selective Feedback on a 400 MHz NMR Spectrometer" Journal of Biomolecular NMR, 265:5 (1995) pp. 212–216.

Breokaert et al. "Supression of Radiation Damping in NMR in Liquids by Active Electronic Feedback"Journal of Magnetic Resonance, Series A 113 (1995), pp. 60–64.

Louis–Joseph, A., Abergel, D., Lallemand, J., "Neutralization of Radiation Damping by Selective Feedback on a 400 MHz NMR Spectrometer" *Journal of Biomolecular NMR*, 265:5 (1995), pp. 212–216.

Broekaert, P., Jeener, J., "Supression of Radiation Dampling in NMR in Liquids by Active Electronic Feedback" *Journal of Magnetic Resonance*, Series A 113, 1995., pp. 60–64.

Vlassenbroek, A., Jeener, J., Broekaert, P., "Radiation Damping in High Resolution Liquid NMR: A Simulation Study", *JCP.tex*, Jun. 12, 1995., pp. 1–13.

*Primary Examiner*—Sandra L. O'Shea
*Assistant Examiner*—Michael Eisenberg
*Attorney, Agent, or Firm*—Edward Berkowitz

[57] ABSTRACT

Radiation damping effects in NMR are compensated by splitting the amplified NMR signal induced in the main probe coil to obtain a correction signal, phase shifting the correction signal to obtain a feedback signal and impressing the feedback signal onto the sample through means independent of the main probe coil.

9 Claims, 2 Drawing Sheets

SUPPRESSION OF RADIATION DAMPING IN NMR

FIELD OF THE INVENTION

The present invention is in the area of NMR probe technology and relates primarily to the reduction of radiation damping effects upon NMR measurements.

BACKGROUND OF THE INVENTION

In an NMR experiment, coherent periodic collective motions of nuclear spins induce RF current in the surrounding probe coil. This current in the probe coil, in turn, applies an RF magnetic field upon those nuclear spins. This type of effect is known in the art as "radiation damping". A common manifestation of radiation damping occurs in the case of liquids in the form of broadening of the solvent line. In the time domain, the time constant of the free induction decay signal is appreciably shortened by the radiation damping effect.

In the prior art, it is known to suppress radiation damping effects by deriving a negative feedback signal from the output of the usual RF amplifier and applying that signal with suitable phase shift, to the probe coil. In this manner, the signal induced in the coil by the periodic motions of the nuclear spins may be substantially canceled. One result of this prior art approach is the reduction of all signals and associated noise by a factor (related to the loop gain for the feedback loop).

DESCRIPTION OF THE PREFERRED EMBODIMENTS

Figure 1:
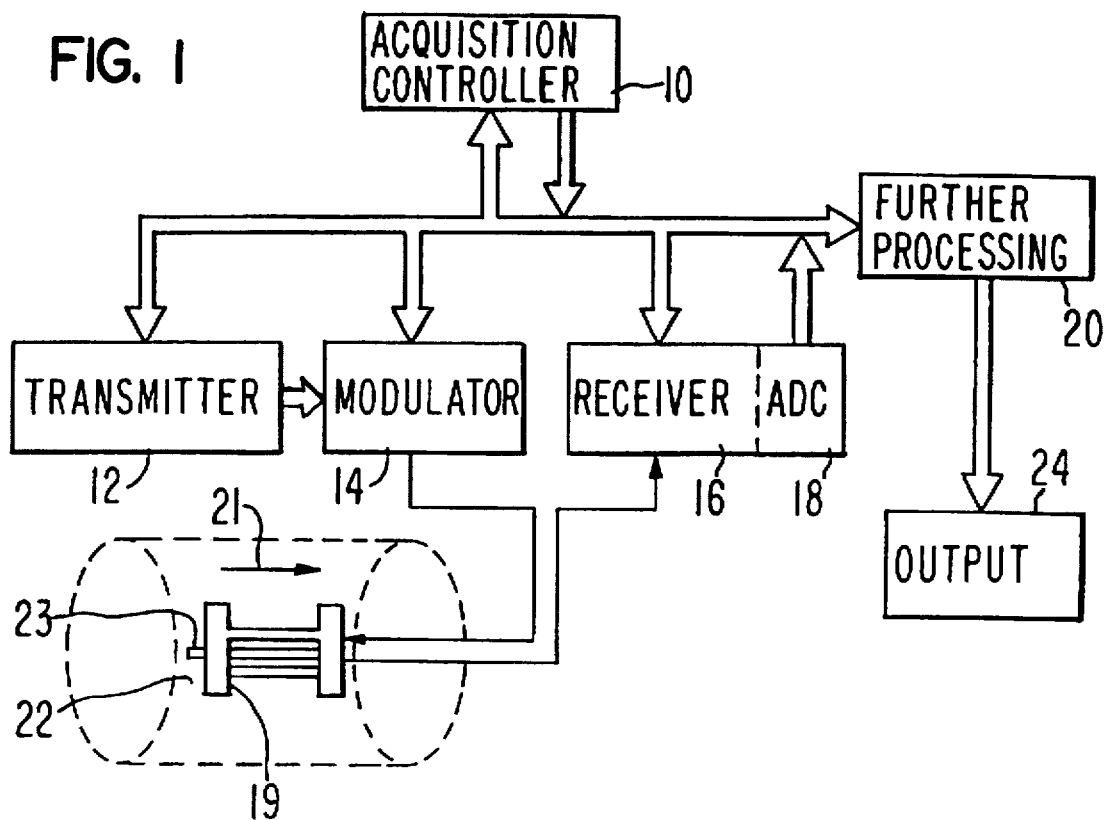
FIG. 1 illustrates a typical NMR instrument incorporating the present invention.

Turning now to FIG. 1, there is shown a typical NMR instrument forming the context for the operation of the present invention. Portions of a typical NMR data acquisition instrument are schematically illustrated in FIG. 1. An acquisition/control processor 10 communicates with an RF transmitter 12, modulator 14 and receiver 16, including analog-to-digital convertor 18 and a further digital processor 20. The modulated RF power irradiates an object 23 in a magnetic field 21 through a probe assembly 22 and response of the object is intercepted by probe assembly 22 communicating with receiver 16. The response typically takes the form of a transient time domain waveform or free induction decay. This transient waveform is sampled at regular intervals and samples are digitized in adc 18. The digitized time domain wave form is then subject to further processing in processor 20. The nature of such processing may include averaging the time domain waveform over a number of similar of such waveforms and transformation of the average time domain wave form to the frequency domain yields a spectral distribution function directed to output device 24. Alternatively this procedure may thus be repeated with variation of some other parameter and the transformation(s) from the data set may take on any of a number of identities for display or further analysis.

The magnetic field 21 is directed parallel to the z axis, which polarizes the sample and defines the Larmor frequency thereof, is established by an appropriate means, not shown. Saddle coil(s) 19 are employed for imposing a desired spacial and time dependence of magnetic field.

Figure 2:
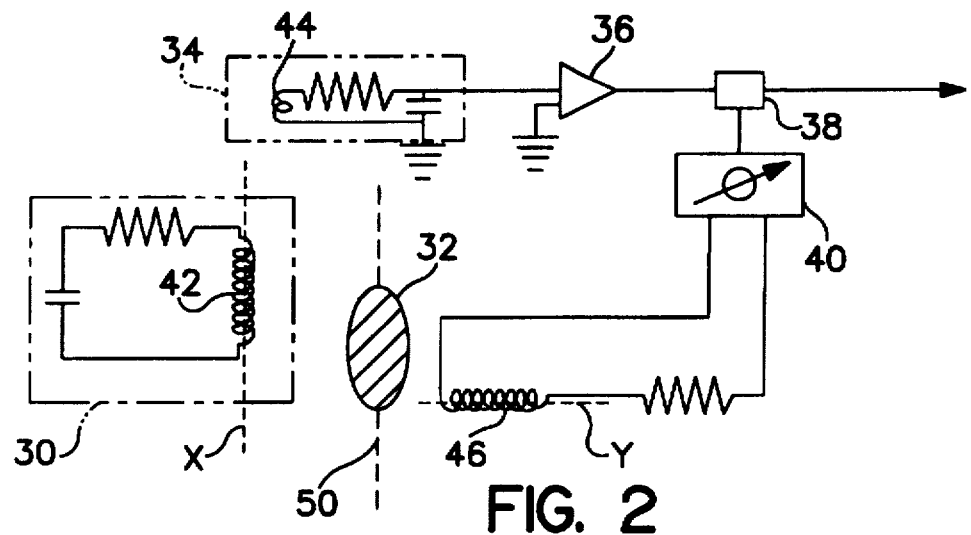
FIG. 2 is a schematicized illustration of an NMR probe of the present invention.

FIG. 2 shows a feedback arrangement of the present invention. Resonant circuit 30 includes a probe coil 42 which is ordinarily disposed to surround sample 32 and which coil has a well defined axis, X. When resonance is excited in sample 32, a circulating current representing that signal is set up in resonant circuit 30 and this signal is coupled through output coupling circuit 34 to a pre-amplifier 36. An inductive coupled circuit is illustrated, but other coupling is well known in the art. The amplified signal with the concomitant noise is split in network 38 and the major portion of the signal is directed toward the rf receiver. A portion defined by splitter network 38 is shifted in phase by phase shifter 40 and the phase shifted resulting signal, the "feedback" signal is directed toward inductance L3 which has an axis Y orthogonal to the X axis of coil 42. Coil 44 is loosely coupled to the sample 32, producing fields along the Y axis within sample 32.

As a result of the precession of nuclear spins of the sample, a current is induced in the coil 42, which in turn produces a field $B_1 = B_X u_x \cos \omega t$, where $u_x$ is a unit vector) along the x axis 50 of sample 32 which is physically contained in the interior of coil 42.

The periodic field $B_1$ acting on the sample spins may be decomposed into two contra-rotating fields, $$B^{(+)}_{1/2} = B_x(u_x \cos \omega t + u_y \sin \omega t)/2$$

$$B^{(-)}_{1/2} = B_x(u_x \cos \omega t - u_y \sin \omega t)/2$$

The precessing nuclear spins are physically responsive to one of the above field components, e.g., that component rotating in the same sense as the nuclear spin precession, for example, $B^{(+)}_{1/2}$. The other component $B^{(-)}_{1/2}$ has only a higher order effect upon the spins and may be safely neglected for the purposes of this explanation.

Consider now the portion of the signal output from preamplifier 36 which is directed through splitter network 38 to phase shifter 40. The amplitude of the portion is selectable through this splitter network and the phase is adjusted to produce a signal from coil 46, $-B_x \sin \omega t$. This field can also be decomposed into two contra-rotating components:

$$B^{(+)}_{1/2} = -B_x(u_x \cos \omega t + u_y \sin \omega t)/2$$

$$B^{(-)}_{1/2} = -B_x(-u_x \cos \omega t + u_y \sin \omega t)/2$$

The first of the above expressions is in the same sense as the precessing nuclei and combined with $B^{(+)}_{1/2}$ above produces a null while the other components have no effect upon the precessing nuclei. Thus the reactive effect of the spins upon themselves is canceled. One observes that the feedback in the present invention is coupled back to the sample and not to the coil.

In the case of the present invention as well as the probe coil feedback arrangement of prior art, oscillation is avoided by careful attention to phase shifts around the loop. For this reason, a signal having the same sense with respect to the signal processed through the splitter network) is avoided (positive feedback). Phase shifter 40 provides an adequate range of phase shift to avoid the undesirable, and achieve the desirable phase shift to produce the optimum compensation. In some instances the cumulative effect of phase shifts occurring over the entire loop may suffice to provide the requisite effect in lieu of a discrete phase shifter 40.

Figure 3:
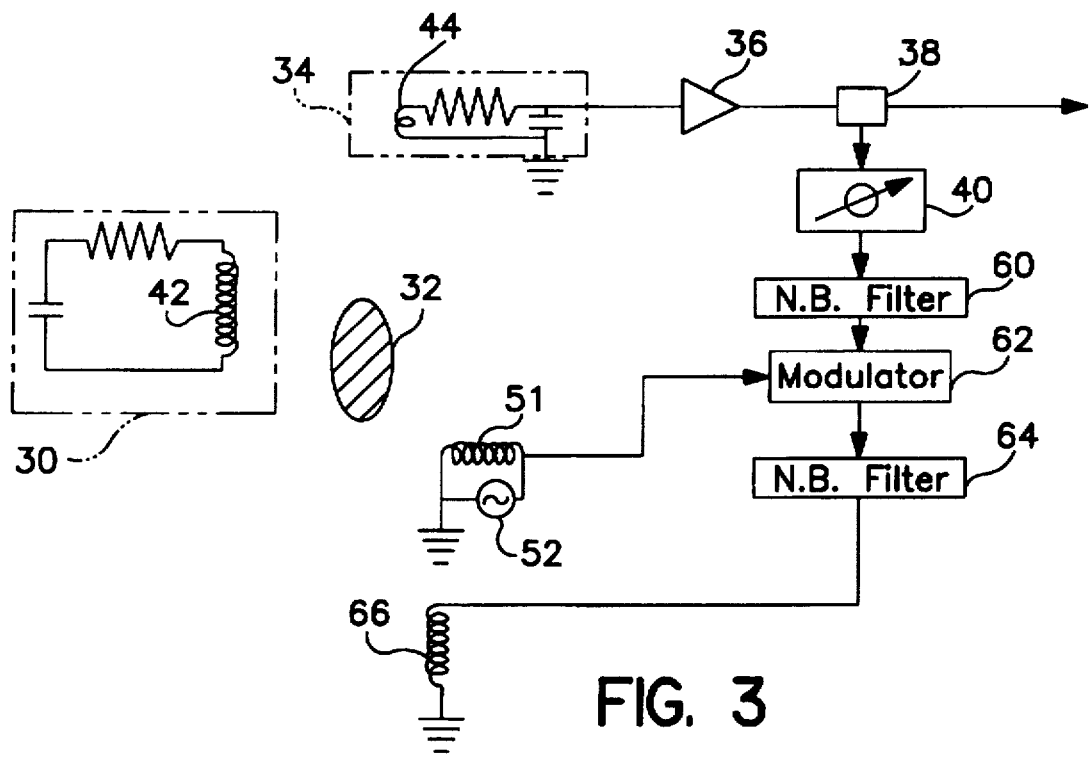
FIG. 3 is a schematicized illustration of another embodiment of the invention.

FIG. 3 shows another embodiment of the invention wherein the feedback coupling to the resonating nuclei is isolated from the probe pickup coupling by frequency offset. This frequency offset embodiment incorporates a field modulation arrangement comprising oscillator 52 which provides an AC field for superposition onto DC polarizing field of the NMR apparatus. The signal path through the probe pickup coil 42, the coupling coil 44, the preamplifier 36 and splitter 38 and phase shifter 40 is identical with the previously described embodiment. The signal derived from the splitter network 38 contains (for low modulation index= $\gamma B_m/\omega_0 \ll 1$) frequency components at the Larmor frequency $\omega_0$, and at the sidebands $\omega_0 \pm \omega_m$. A narrow band filter 60 selects one of these sidebands, say $\omega_0 - \omega_m$. This sideband is then modulated by a balanced modulator 62 with the signal $\omega_m$ derived from the oscillator 52. The output of balanced modulator 62 contains outputs at lower sideband $\omega_0 - 2\omega_m$ and upper sideband ($\omega_0$). Let the upper sideband ($\omega_0$) be selected by narrow band filter 64 and applied to feedback coil 66 which imposes a correcting field $B_2$ on the resonating nuclei. The field $B_2$ may be parallel to the axis of the probe coil 42 and oppositely directed to the nuclear magnetism to counter the damping of the free induction decay signal. Alternatively, with the appropriate phaseshift, the field $B_2$ from coil 60 may be applied at an angle with respect to the axis of coil 42. With a 90° phase shift the field $B_2$ may be applied along the y axis as shown in FIG. 2.

Regenerative feedback is avoided since any signal from coil 66, after being detected by coil 42 and coil 34, will have its frequency shifted by $\pm\omega_m$ after passing through balanced modulator 62. The shifted frequencies will then be blocked by one of the narrow band filters 60 or 64. The small magnetic field modulation by coil 51 is capable of modulating only the nuclear resonance signals.

Many modifications and variations are possible within the scope of the invention. For example coil 42 could be coupled electrically to preamplifier 36 rather than magnetically as shown in FIGS. 2 and 3. Although the invention is described as applied to a Fourier Transform (FT) NMR it can be applied to other types of NMR spectrometer. In FTNMR a short pulse from the transmitter is used to excite resonance. Other forms of excitation include wideband excitation using a random or pseudo-random pulse sequence, and continuous wave (CW) excitation. It is understood that all such variations and modifications will be apparent to one of average skill in the art and are within the scope of the invention.

The foregoing description has been limited to specific embodiments of the invention. It is apparent that variations and modifications may be made to the invention with the attainment of some or all of the advantages described. Therefore, it is an object of the appended claims to cover all such variations and modifications as come within the true scope and spirit of the claims.

What is claimed is:

1. The method of reduction of radiation damping phenomena in an NMR instrument having an excitation coil for inducing resonance in a sample, a probe coil onto which a signal is induced from said resonating sample, comprising:
    (a) supplying rf energy to the excitation coil to bring said sample to a resonant state,
    (b) inducing an rf signal originating from said resonant nuclei onto said probe coil and directing that rf signal to an amplifier,
    (c) amplifying said signal and splitting said signal to obtain a portion thereof to obtain a correction signal,
    (d) phase shifting said correction signal by a selected angle to obtain a feedback signal,
    (e) coupling said feedback signal to said sample without significant coupling of said feedback signal to said probe coil.

2. The method of claim 1 wherein said step of coupling said feedback signal to said sample comprises arranging a feedback coil orthogonal to the axis of said probe coil and connecting said feedback signal to said feedback coil.

3. The method of claim 1 wherein said excitation coil also serves as said probe coil.

4. An NMR probe for compensating radiation damping effects on NMR measurements of a selected sample, comprising,
    a probe coil having a first axis for receiving an rf signal from said sample,
    a splitting circuit for deriving from said rf signal a correction signal,
    a phase shifter for altering the phase angle of said correction signal to obtain a feedback signal, and
    a feedback coil connected to said phase shifter for coupling said feedback signal to said sample, said feedback coil having an axis orthogonal to the axis of said probe coil.

5. The NMR probe of claim 4 wherein said phase shifter comprises the accumulated phase shifts attendant to all components of said NMR probe.

6. The method of reduction of radiation damping phenomena in an NMR instrument having a polarizing field, an excitation coil for inducing resonance in a sample, a probe coil onto which a signal is induced from said resonating sample, comprising:
    (a) supplying rf energy to the excitation coil to bring said sample to resonance,
    (b) modulating the polarizing field with an AF signal,
    (c) inducing an rf signal originating from said resonant nuclei onto said probe coil and directing that rf signal to an amplifier,
    (d) amplifying said signal and splitting said signal to obtain a portion thereof to obtain a correction signal,
    (e) phase shifting said correction signal by a selected angle to obtain a feedback signal,
    (f) selecting a component of said feedback signal and modulating said component with said AF signal to obtain a correction signal,
    (g) coupling said correction signal to said sample.

7. The method of claim 6 said step of coupling is achieved without significant coupling of said feedback signal to said probe coil.

8. An NMR instrument comprising,
    a polarizing magnet,
    a source of RF excitation energy to excite resonance in a sample and an RF receiver for receiving resonant signals from said sample and a processor for deriving spectral information from said signals,
    an rf probe for applying said RF excitation energy to a sample to induce a resonant state therein, and for receiving the resonant RF signal emitted from said sample,
    said probe comprising
        a probe coil aligned along a first probe axis and arranged around said sample for receiving said signal from said sample,
        a coupling circuit disposed to pass said signal for subsequent processing and for dividing said signal to define a minor portion thereof as a correction signal,
        a phase shifter operating upon said correction signal to produce a feedback signal,
        a second probe coil aligned along an axis orthogonal to said first probe axis and surrounding said sample, said second probe coil connected to said phase shifter thereby to impress said feedback signal on said sample.

9. The NMR instrument of claim 8 wherein said phase shifter is realized from the accumulated phase shifts of all components of said probe.

* * * * *